July 18, 1961 E. A. PETROCELLI ET AL 2,993,129

AMPLIFIER CIRCUITS

Filed Feb. 19, 1958

WITNESSES

John E. Healy, Jr.

Myron E. Click

INVENTORS

Edward A. Petrocelli &

Bent Christensen

BY F. E. Browder

ATTORNEY 2,993,129
Patented July 18, 1961

2,993,129

AMPLIFIER CIRCUITS

Edward A. Petrocelli, Franklin Township, Allegheny County, and Bent Christensen, Monroeville, Pa., assignors to Westinghouse Electric Corporation, East Pittsburgh, Pa., a corporation of Pennsylvania Filed Feb. 19, 1958, Ser. No. 716,171
7 Claims. (Cl. 307—88.5)

This invention relates to amplifiers in general, and in particular to amplifiers utilizing switching hyperconductive semiconductor diodes.

The advent of a semiconductor diode having such characteristics that on a certain specified reversed current and voltage the diode becomes highly conductive and thereafter will carry a substantial reversed current at low voltages, has led to many new electronic applications. The phenomenon described above is not a Zener breakdown nor is it an avalanche breakdown. This unique breakdown characteristic can be repeated indefinitely. This breakdown has been referred to as hyperconductive breakdown and a diode having such a characteristic will be referred to hereinafter as a hyperconductive diode.

Such a hyperconductive diode with controllable reversible breakdown characteristics or hyperconductive breakdown may comprise a first base element which consists of a semiconductor member doped with an impurity to provide a first type of semiconductivity, either N or P. Upon this first base element is an emitter element consisting of a semiconductor material doped with the opposite type of semiconductivity. This emitter element may be prepared by alloying a pellet containing a doping impurity to a wafer of semiconductor material forming the first base element. An emitter junction is present at the zone between the first base element and the emitter element.

In order to facilitate the connection of the diode into an electrical circuit, a layer of silver or other good conductive metal may be fused, alloyed into, or soldered with the upper surface of the emitter. Copper lead wires may be readily soldered to this layer.

A second base element of opposite conductivity is provided next to the first base element. A zone where the first and second base elements meet forms a collector junction.

Next to the second base element is a mass of metal which is a source of carriers that play a critical part in the function of the diode. This mass of metal may be neutral or it may have the same doping characteristics as the second base. The mass of metal may be applied to the second base element by a soldering, alloying, fusing, or other similar well-known method.

A hyperconductive diode having the characteristics aforementioned is described in a copending application Serial No. 642,743, entitled "Semiconductor Diode," filed February 27, 1957, now Patent No. 2,953,693, and assigned to the same assignee as the present invention. For a more detailed description of the construction, characteristics, and operation of such a hyperconductive diode, reference is made to the above copending application Serial No. 642,743.

It is an object of this invention to provide an improved amplifier circuit.

It is another object of this invention to provide an improved amplifier circuit in which an input signal does not have to be phased with the power supply for proper operation.

Further objects of this invention will become apparent in the following description when taken in conjunction with the accompanying drawing. In said drawing, for illustrative purposes only, there is illustrated a preferred embodiment of the invention.

Figure 1:
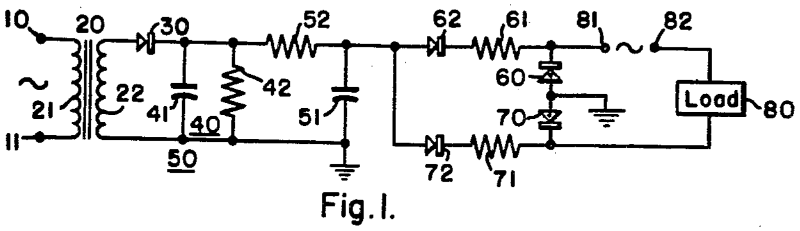
FIG. 1 is a schematic diagram of an amplifier circuit embodying the teachings of this invention.

Referring to FIG. 1 there is illustrated an amplifier circuit embodying the teachings of this invention which comprises in general, an energy storing circuit 50, and a pair of hyperconductive diodes 60 and 70. The energy storage circuit 50 comprises terminal means 10 and 11 for applying an input signal, a step-up transformer means 20, rectifying means 30, filtering means 40, and capacitive means 51. The terminal means 10 and 11 are connected to the leads of the primary winding 21 of the step-up transformer 20. A secondary winding 22 is serially connected with the rectifier means 30, a charging resistor 52, and the capacitive means 51. The filtering means 40 comprises a paralleled capacitor 41 and resistor 42 which are connected across a rectifier 30 and the secondary winding 22. The capacitive means 51, comprising the output connection of the energy storage circuit 50, is connected through a rectifying means 62 and a current limiting resistor 61 across the hyperconductive diode 60. The capacitive means 51 is also connected through a rectifier means 72 and a current limiting impedance 71 across the hyperconductive diode 70. The hyperconductive diodes 60 and 70 are connected in a back-to-back manner in series with a load 80 between terminal means 81 and 82 for applying an alternating-current voltage power supply.

Figure 3:
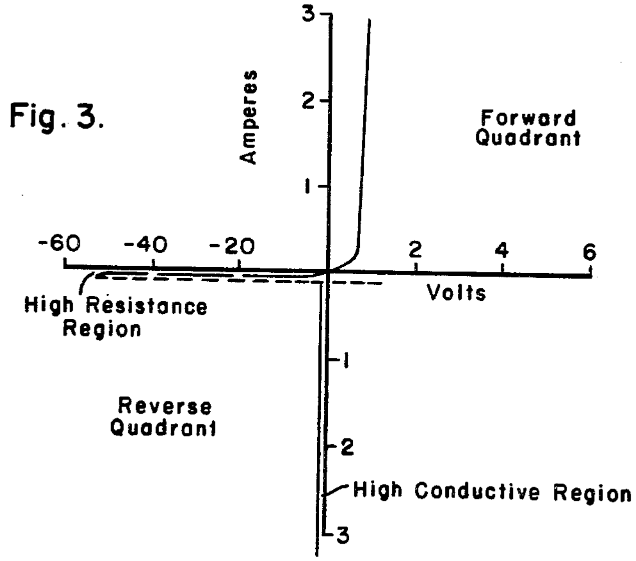
FIG. 3 is a graphical representation of the operating characteristics of the hyperconductive diode to be utilized in this invention.

Referring to FIG. 3, the curve shows how the semiconductor diode responds to the application of different voltages. Considering the upper right or forward quadrant, when a forward voltage of the order of one voltage per unit is applied, the current builds up to approximately three current units. When the voltage is reversed, it builds up in a reversed direction to about 55 voltage units with only a small fraction of a current unit of current flowing, and then the diode suddenly becomes hyperconductive or highly conductive and the voltage drops to about one voltage unit as shown in the lower left or reverse quadrant. The diode becomes a conductor with a low ohmic resistance and the current builds up rapidly to several current units.

As shown in the reverse quadrant when the diode breaks down the voltage drops along a substantially straight line to approximately one voltage unit, and very little power is dissipated in maintaining the diode highly conductive. Thus, the diode is designated as a hyperconductive diode since upon breakdown after passing through the negative resistance region, superconduction or hyperconduction of current results at very low resistance. The diode can be rendered highly resistant again by reducing the current below a minimum threshold value and the voltage below the critical breakdown value. Consequently, the curve can be repeatedly followed as desired by properly controlling the magnitude of reverse current and voltage.

Referring again to FIG. 1, a small alternating-current input signal is to be applied to the terminals 10 and 11. A transformer 20 steps up the input signal, the rectifying means 30 rectifies the signal and the filtering means 40 filters the signal. The signals will therefore cause the the capacitor 51 to be charged through the charging resistor 52.

When the capacitor 51 is charged, the magnitude of the charge across the capacitance 51 reaches the critical breakdown value of the hyperconductive diodes 60 and 70. Since the output from the energy storing circuit 50, i.e., the charge across the capacitor 51, is connected across both of the hyperconductive diodes 60 and 70 the hyperconductive diode connected to the positive terminals of the alternating-current voltage supply will be the only one of the hyperconductive diodes 60 and 70 to break down. After the hyperconductive diode connected to such positive terminal has broken down, load current will flow through the load 80. On the next half-cycle of the alternating-current supply voltage the other hyperconductive diode will break down and load current will flow in the opposite direction through the load 80.

The breakdown or firing of the hyperconductive diode will happen many times during each half-cycle of the alternating-current supply voltage because the energy storage circuit 50 and the hyperconductive diodes 60 and 70 combine to perform the function of a relaxation oscillator, the frequency of which is much higher than the frequency of the alternating current supply voltage to be connected to terminals 81 and 82.

With no input signal at the terminals 10 and 11, there will be no charge developed upon the capacitative means 51 and the hyperconductive diodes 60 and 70 cannot break down, for their critical breakdown voltage is higher than the peak value of the alternating-current supply voltage to be connected to the terminals 81 and 82.

One of the prime advantages of the circuit illustrated in FIG. 1 is that the firing or breaking down of the hyperconductive diode is accomplished with a train of pulses rather than one pulse properly phased with respect to the supply voltage. With many pulses per half-cycle, one pulse must fall very close to the beginning of the half-wave when conduction should take place through the load 80. Since pulses are present across the hyperconductive diodes 60 and 70 throughout a cycle of the power supply voltage there is no phasing problem with the input signal. Almost a full 180° of conduction takes place to the load for each half-cycle of the power supply voltage to be connected to the terminals 81 and 82.

Figure 2:
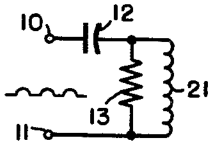
FIG. 2 is a schematic diagram of an alternate input circuit which may be used with the apparatus illustrated in FIG. 1.

Referring to FIG. 2 there is illustrated schematically an alternate input circuit for the apparatus of FIG. 1 in which like components have been given the same reference characters. Since only the input portion is affected by the modification, the remainder of the circuit has not been shown. In FIG. 2 a capacitor 12 and the primary winding 21 of the step-up transformer 20 are serially connected between the input terminals 10 and 11. A resistor 13 has been connected across the primary winding 21.

The capacitance 12 and the resistor 13 are added to prevent saturation of the input step-up transformer 20 when the input signal is other than an alternating-current signal, for example, a pulsating half-wave direct current. The combination of the capacitance 12 and the resistor 13 changes the pulsating or half-wave input signal to an alternating current as far as the primary windings 21 of the step-up transformer 20 is concerned.

The invention described hereinbefore can deliver an alternating current to either a resistive, inductive or capacitive load. In prior art circuits, pulses must be phased to appear across the hyperconductive diodes at zero degrees and 180° when driving a resistive load. when driving an inductive load these pulses must be phased to appear at 90° and 270°. This would mean that a phase shifting network would be required. With the train of pulses described above to break down the hyperconductive diodes no such phase shift network is required, because pulses are available throughout the cycle.

In conclusion, it is pointed out that while the illustrated examples constitute a practical embodiment of our invention, we do not limit ourselves to the exact details shown, since modifications of the apparatus illustrated and described herein may be varied without departing from the spirit and scope of this invention.

We claim as our invention:

1. In an amplifier circuit, in combination; a relaxation oscillator having means for receiving an input signal; first and second hyperconductive diodes; and a load circuit having means for applying an alternating-current power supply to a load; said first and second hyperconductive diodes being connected in a back-to-back manner in said load circuit to control current flow in said load circuit; the magnitude of said power supply being smaller than the critical breakdown voltage of said first and second hyperconductive diodes; said relaxation oscillator being connected across each of said first and second hyperconductive diodes and being operative to cause hyperconductive breakdown of said diodes in response to an input signal.

2. In an amplifier circuit, in combination; a relaxation oscillator having means for receiving an input signal; first and second hyperconductive diodes; and a load circuit having means for applying alternating-current power supply to a load; said first and second hyperconductive diodes being connected in a back-to-back manner in said load circuit to control current flow in said load circuit; the magnitude of said power supply being smaller than the critical breakdown voltage of said first and second hyperconductive diodes; said relaxation oscillator being connected across each of said first and second hyperconductive diodes and being operative to cause hyperconductive breakdown of said diodes in response to an input signal; the frequency of said relaxation oscillator being greater than the frequency of said alternating-current power.

3. In a control circuit, in combination; a relaxation oscillator having means for receiving an input signal; a load circuit having means for applying a power supply to a load; hyperconductive diode means being connected in said load circuit to control current flow in said load; the breakdown voltage of the hyperconductive diode means being greater than the magnitude of the potential across said diode means from the power supply; said relaxation oscillator being operatively connected to cause hyperconductive breakdown of said diode means in response to an input signal.

4. In a control circuit, in combination; a relaxation oscillator having means for receiving an input signal; a load circuit having means for applying a power supply to a load; hyperconductive diode means being connected in said load circuit to control current flow in said load; the breakdown voltage of the hyperconductive diode means being greater than the magnitude of the potential across said diode means from the power supply; said relaxation oscillator being operatively connected to provide a train of pulses to said hyperconductive diode means of a magnitude greater than said breakdown voltage in response to an input signal.

5. In a control circuit, in combination; a relaxation oscillator having means for receiving an input signal; a load circuit having means for applying an alternating current power supply to a load, first and second hyperconductive diodes connected in said load circuit to control current flow in said load circuit and having a breakdown voltage greater than the magnitude of the potential across said hyperconductive diodes from the power supply, said relaxation oscillator being operatively connected to provide a plurality of pulses across said hyperconductive diodes during each half cycle of the alternating current supply of a magnitude sufficient to cause breakdown of said diodes in response to an input signal.

6. In a control circuit, a relaxation oscillator having input signal means and having a first and second hyperconductive diode connected back-to-back in electrical opposition, said first and second hyperconductive diodes adapted to be connected in a common series loop with an alternating current power supply and a load device, the breakdown voltage of the hyperconductive diodes being greater than the magnitude of the potential across said diodes from the power supply, said relaxation oscillator being operatively connected to provide a train of voltage pulses each having a magnitude sufficient to cause breakdown of said hyperconductive diodes many times during each half cycle of the alternating current power supply in response to an input signal.

7. In a control circuit, a high frequency relaxation oscillator having input signal means and having a first and second hyperconductive diode connected back-to-back in electrical opposition, said first and second hyperconductive diodes adapted to be connected in a common series loop with a low frequency alternating current power supply and a load device, the breakdown voltage of the hyperconductive diodes being greater than the magnitude of the potential across said diodes from the power supply, said relaxation oscillator being connected across each of said first and second hyperconductive diodes to provide a train of voltage pulses each having a magnitude sufficient to cause breakdown of said hyperconductive diodes many times during each half cycle of the alternating current power supply in response to an input signal.

References Cited in the file of this patent

UNITED STATES PATENTS

| | | |
|---|---|---|
| 1,883,613 | Devol | Oct. 18, 1932 |
| 2,098,370 | Bartels | Nov. 9, 1937 |
| 2,182,377 | Guanella | Dec. 5, 1939 |
| 2,418,516 | Lidow | Apr. 8, 1947 |
| 2,666,816 | Hunter | Jan. 19, 1954 |
| 2,899,569 | Kircher | Aug. 11, 1959 |

OTHER REFERENCES

Negative Resistance in Germanium Diodes, by James Kauke, Radio-Electronic Engineering, April 1953, pages 8–10.